United States Patent [19]

Oki

[11] Patent Number: 4,525,061

[45] Date of Patent: Jun. 25, 1985

[54] COMBINATION OF A PLATE FOR EXPOSURE AND FRAME PLATES

[75] Inventor: Toshiro Oki, Tama, Japan

[73] Assignee: ORC Manufacturing Co., Ltd., Tokyo, Japan

[21] Appl. No.: 503,538

[22] Filed: Jun. 13, 1983

[30] Foreign Application Priority Data

Jun. 14, 1982 [JP] Japan ................................ 57-101620

[51] Int. Cl.³ .............................................. G03B 27/58
[52] U.S. Cl. ......................................... 355/72; 355/76
[58] Field of Search ............................. 355/72, 73, 91

[56] References Cited

U.S. PATENT DOCUMENTS 3,170,368  2/1965  Barnhart ................................ 355/73
3,635,558  1/1972  Le Peer et al. ....................... 355/72

*Primary Examiner*—Monroe H. Hayes

*Attorney, Agent, or Firm*—Fidelman, Wolffe, and Waldron

[57] ABSTRACT

A combination of a plate for exposure, such as a printed circuit board, having a pair of photosensitive layers formed on its opposite surfaces, and a pair of transparent frame plates between which the plate for exposure can be sandwiched, and which are each provided with a mask on its surface facing the plate for exposure. The plate for exposure is formed with a pair of apertures adjacent to each of a pair of opposite edges thereof. Each of the frame plates is provided adjacent to each of a pair of opposite edges thereof with a pin facing one of the apertures and a recess facing the other aperture. The pin on one of the frame plates faces the recess in the other frame plate. The pins are so sized and shaped that they can be easily fitted in, and removed from the apertures, and can hold the frame plates against displacement relative to the plate for exposure when fitted in the apertures.

3 Claims, 6 Drawing Figures

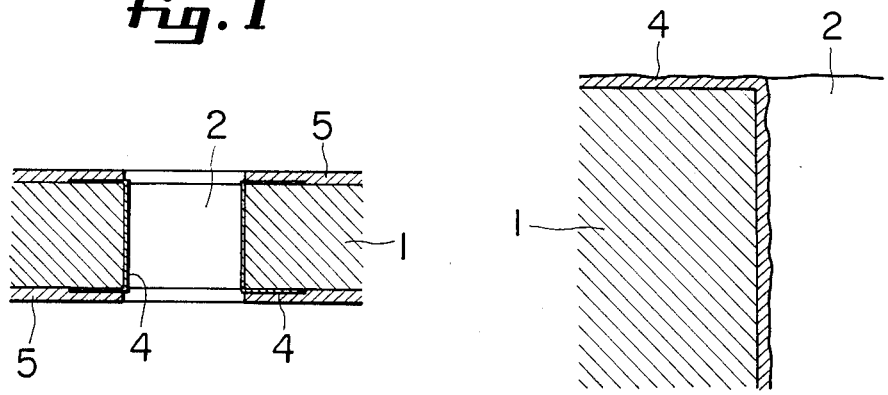
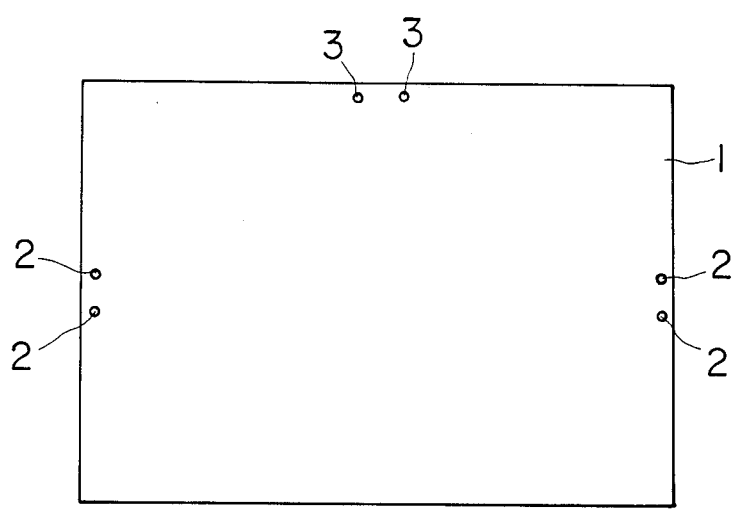

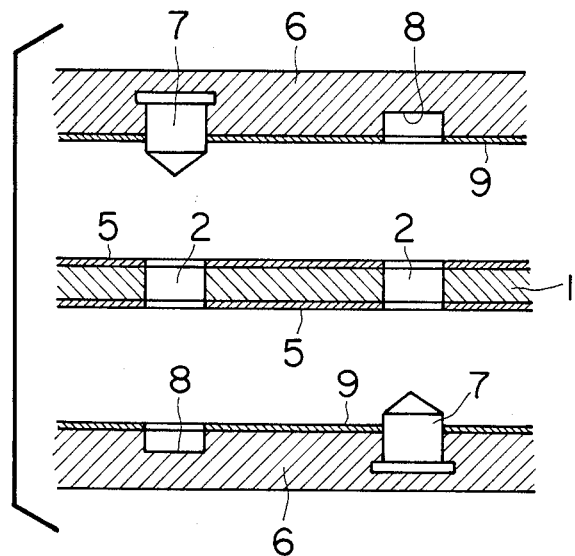
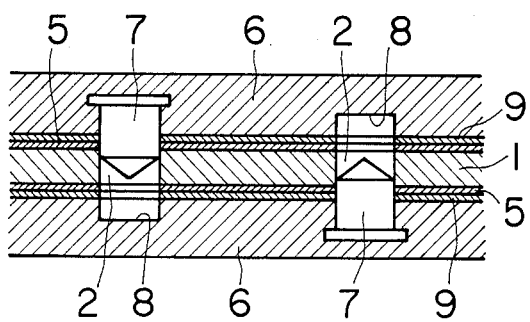
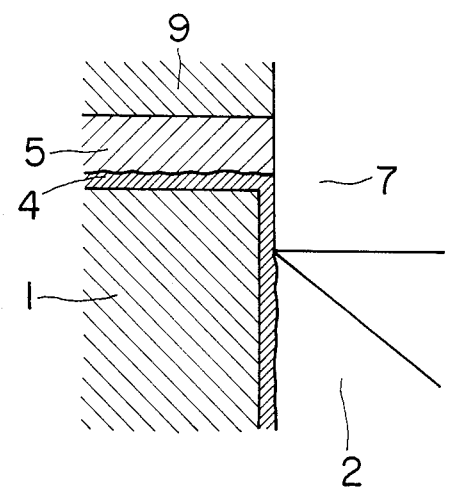

COMBINATION OF A PLATE FOR EXPOSURE AND FRAME PLATES

BACKGROUND OF THE INVENTION

1. Field of the Invention

This invention relates to a combination of a plate for exposure and frame plates which is used with an exposure device.

2. Description of the Prior Art

There is known a combination of a plate 1 for exposure having a pair of photosensitive layers 5 coated on its opposite surfaces, respectively, and a pair of transparent frame plates between which the plate 1 is disposed. The plate 1 is, for example, a printed circuit board. The plate 1 is formed therethrough with at least two positioning apertures 2 adjacent to its peripheral edge. The plate 1 and the photosensitive layers 5 are fragmentarily shown in FIG. 1 in which one of the positioning apertures 2 is also shown. One of the frame plates, or the lower frame plate is provided with a corresponding number of positioning pins on its upper surface adjacent to its peripheral edge, and mounted in an exposure device. The lower frame plate carries a mask in the form of a film or sheet on its upper surface. The plate for exposure is attached to the lower frame plate by the positioning pins fitted in the positioning apertures. The upper frame plate is also formed with the corresponding number of positioning apertures adjacent to its peripheral edge, and carries a mask on its lower surface. The pins of the lower frame plate extend through the apertures of the plate for exposure into the apertures of the upper frame plate, whereby the plate for exposure and the two frame plates are put together. The plate for exposure is exposed to the light radiated through the upper and lower frame plates.

The surfaces of the plate 1 are covered by a copper coating 4 which also covers the peripheral surfaces of the apertures 2. The thickness of the copper coating 4 lacks uniformity for various reasons; therefore, it presents a considerably uneven surface particularly in the apertures 2, as shown in FIG. 2. This uneven surface requires an excessively large force for the insertion of the positioning pins into the apertures 2 of the plate 1, since the apertures 2 and the pins are substantially equal in diameter to each other to achieve a higher degree of positional accuracy. A large force is, therefore, required for removing the pins from the apertures. When the pins are forced into the apertures 2, the copper coating 4 in the apertures 2 is partly peeled by the pins, and the dust of the copper coating 4 adheres to the surfaces of the photosensitive layers 5. This has been a major cause for the formation of a defective mask pattern for exposure.

The positioning of the plate 1 for exposure is based on the lower frame plate, as hereinabove stated. Therefore, it is often difficult to position the plate 1 accurately with respect to the upper frame plate, and it is in many cases necessary to ascertain the accuracy of their positioning visually.

SUMMARY OF THE INVENTION

It is an object of this invention to provide an improved combination of a plate for exposure and frame plates which ensures a higher degree of accuracy in the alignment of mask patterns to be printed on both sides of the plate for exposure when they are exposed to light, and facilitates the attachment of the frame plates to the plate for exposure and their detachment.

The improved combination comprises a plate for exposure provided with a pair of apertures adjacent to each of a pair of opposite edges thereof, and a pair of frame plates between which the plate for exposure can be disposed, and which is provided with a pin adjacent to each of a pair of opposite edges thereof. When the plate for exposure is sandwiched between the frame plates, the pin on one of the frame plates fits in one of the apertures, and the pin on the other frame plate fits in the other aperture, at each of a pair of opposite ends of the assembly. Each frame plate has a recess facing one of the apertures in the plate for exposure and the pin on the other frame plate to receive the tip of the pin projecting through the aperture in the event a plate for exposure having a smaller thickness.

BRIEF DESCRIPTION OF THE DRAWINGS

FIG. 1 is a fragmentary cross sectional view of a plate for exposure showing an aperture in particular;

FIG. 2 is a fragmentary enlarged view of the plate showing a copper coating in the apreture;

FIG. 3 is a top plan view of a plate for exposure in a combination embodying this invention;

FIG. 4 is a fragmentary exploded view, in cross section, of the combination embodying this invention;

FIG. 5 is a fragmentary cross sectional view of the combination as put together; and FIG. 6 is a fragmentary enlarged cross sectional view of the combination showing in particular a pin fitted in an aperture.

DETAILED DESCRIPTION OF THE INVENTION

Referring to FIGS. 4 and 5 of the drawings, a combination embodying this invention comprises a plate 1 for exposure having a pair of photosensitive layers 5 bonded to its opposite surfaces, and a pair of transparent frame plates 6 between which the plate 1 can be sandwiched. The plate 1 may be, for example, a printed circuit board. Each frame plate 6 carries a mask 9 in the form of a film or sheet on its inner surface which faces the plate 1.

The plate 1 is formed with a pair of apertures 2 adjacent to each of a pair of opposite edges thereof, as shown in FIG. 3. The apertures 2 ensure positioning or alignment when the frame plates 6 are assembled with the plate 1. Each frame plate 6 is provided adjacent to each of a pair of opposite edges thereof with a positioning pin 7 facing one of the apertures 2 and a recess 8 facing the other aperture 2. Each pin 7 is so sized and shaped as to fit in a corresponding aperture 2 tightly, but in such a manner that it may not totally fill the aperture 2, as shown in FIGS. 5 and 6. Each recess 8 in one of the frame plates 6 is so located as to face one of the pins 7 on the other frame plate 6.

Each pin 7 forms a semipermanent or substantially integral part of the frame plate 6, and is, therefore, of fixed length. On the contrary, the plate 1 for exposure is available in a variety of types having different thicknesses in the range of, say, 0.1 to 3.2 mm. Therefore, each recess 8 is provided for receiving the tip of a corresponding pin 7 projecting through a corresponding aperture 2 in the event the plate 1 has so small a thickness that the pin 7 would otherwise interfere with the frame plate 6.

The plate 1 is usually provided with a third pair of apertures 3 in the center adjacent to one of the other pair of edges thereof, as shown in FIG. 3. The apertures 3 are used for positioning the plate 1 in an exposure device.

According to this invention, the positioning pins 7 are provided on each of the frame plates 6 as hereinabove described. This arrangement enables independent positioning of the frame plates 6 relative to the plate 1. In other words, the plate 1 serves as a base for the positioning or alignment of the two frame plates 6 with each other. The apertures 2 in the plate 1 have a fixed positional relationship to each other, and therefore, the pins 7 on the frame plates 6 also have a fixed positional relationship to each other. This relationship ensures accurate positioning of the frame plates 6 with the plate 1.

According to this invention, the pins 7 are not primarily fitted in the apertures 2 for securing the frame plates 6 to the plate 1, but only to the extent required for holding the frame plates 6 against displacement along the surfaces of the plate 1, though to that extent they are tightly fitted, as is obvious from FIG. 5, and more particularly, from FIG. 6. This arrangement prevents any substantial peeling of copper coating 4 by the pins 7 from the peripheral walls of the apertures 2 when the pins 7 are inserted into the apertures 2, even if the thickness of the copper coating 4 lacks uniformity. Moreover, no large force is required for fitting the pins 7 into the apertures 2, or removing the pins from the apertures. Therefore, it is possible to eliminate substantially any adherence of dust of copper coating to the surfaces of the plate 1 that would result in the formation of defective mask patterns upon exposure. It is also possible to facilitate a job of exposure drastically, as no large force is required to assemble or disassemble the combination of the plate 1 and the frame plates 6. Moreover, the frame plates 6 have a greatly prolonged life, since the pins 7 hardly get worn or damaged during their insertion into, or removal from the apertures 2.

What is claimed is:

1. In a combination of a plate for exposure having a pair of photosensitive layers formed on its opposite surfaces, and a pair of transparent frame plates between which said plate for exposure can be sandwiched, a mask being provided on that surface of each of said frame plates which faces said plate for exposure, the improvement wherein said plate for exposure is formed with a pair of apertures adjacent to each of a pair of opposite edges thereof, each of said frame plates being provided adjacent to each of a pair of opposite edges thereof with a pin facing one of said apertures and a recess facing the other of said apertures, said pin on one of said frame plates facing said recess in the other frame plate, said pins being so sized and shaped that they can be easily fitted in, and removed from said apertures, and can hold said frame plates against displacement relative to said plate for exposure when fitted in said apertures.

2. A combination as set forth in claim 1, wherein said plate for exposure is a printed circuit board.

3. A combination as set forth in claim 1 or 2, wherein each of said pins has a tapered tip.

* * * * *